(12) United States Patent
Maheshwari et al.

(10) Patent No.: US 12,413,231 B2
(45) Date of Patent: Sep. 9, 2025

(54) CIRCUITS AND METHODS FOR ROUTING CROSSBARS WITH PROGRAMMABLE VIAS

(71) Applicant: Intel Corporation, Santa Clara, CA (US)

(72) Inventors: Atul Maheshwari, Portland, OR (US); Wayson Lowe, Redwood City, CA (US); David Parkhouse, Portland, OR (US); Alexander Andreev, San Jose, CA (US); Ban Wong, Milpitas, CA (US)

(73) Assignee: Altera Corporation, San Jose, CA (US)

( * ) Notice: Subject to any disclaimer, the term of this patent is extended or adjusted under 35 U.S.C. 154(b) by 840 days.

(21) Appl. No.: 17/483,026

(22) Filed: Sep. 23, 2021

(65) Prior Publication Data

US 2022/0014197 A1    Jan. 13, 2022

(51) Int. Cl.
*H03K 19/0185* (2006.01)
*H10D 84/90* (2025.01)

(52) U.S. Cl.
CPC ... *H03K 19/018585* (2013.01); *H10D 84/907* (2025.01); *H10D 84/975* (2025.01)

(58) Field of Classification Search
CPC ..... H01L 27/11807; H01L 2027/11875; H03K 19/018585
See application file for complete search history.

(56) References Cited

U.S. PATENT DOCUMENTS

| | | | | |
|---|---|---|---|---|
| 6,642,744 | B2 * | 11/2003 | Or-Bach | H01L 27/118 326/38 |
| 7,750,669 | B2 | 7/2010 | Spangaro | |
| 8,283,701 | B2 * | 10/2012 | Becker | H01L 27/11807 257/E27.099 |
| 9,024,657 | B2 * | 5/2015 | Andreev | H03K 19/018585 326/38 |
| 9,324,718 | B2 * | 4/2016 | Wu | H10B 63/84 |
| 2005/0212562 | A1 * | 9/2005 | Gliese | H01L 27/11807 326/98 |
| 2012/0007038 | A1 * | 1/2012 | Strukov | H01L 27/11807 257/5 |
| 2017/0256587 | A1 * | 9/2017 | Tsuji | H03K 19/17728 |

* cited by examiner

*Primary Examiner* — Jany Richardson
(74) *Attorney, Agent, or Firm* — InventIQ Legal LLP; Steven J. Cahill

(57) ABSTRACT

An integrated circuit includes first and second routing crossbars. The second routing crossbar includes first conductors routed in a first direction in a first conductive layer and second conductors routed in a second direction that is perpendicular to the first direction in a second conductive layer. A first subset of the first conductors is coupled to the first routing crossbar. The first subset of the first conductors is coupled to a second subset of the first conductors through a first subset of the second conductors that is coupled to the first and second subsets of the first conductors through first vias. The second subset of the first conductors is coupled to a second subset of the second conductors to through second vias. At least one of the first conductors is decoupled from another one of the first conductors by third vias.

20 Claims, 4 Drawing Sheets

CIRCUITS AND METHODS FOR ROUTING CROSSBARS WITH PROGRAMMABLE VIAS

FIELD OF THE DISCLOSURE

The present disclosure relates to electronic integrated circuits, and more particularly, to circuits and methods for routing crossbars with programmable vias.

BACKGROUND

A field programmable gate array (FPGA) is a type of integrated circuit (IC) that includes programmable interconnects and programmable logic blocks. The interconnects and logic blocks are programmable after fabrication in an FPGA. In an application specific integrated circuit (ASIC), the logic circuitry and interconnects typically have substantially less configurable features after fabrication than an FPGA. In general, an ASIC can implement a larger circuit design than an FPGA, because an ASIC is designed to use die area more efficiently, but ASIC design flow is often more expensive and complex than configuring an FPGA. A structured application specific integrated circuit (ASIC) has intermediate features between a standard ASIC and an FPGA. A structured ASIC may have the same basic logic structure as an FPGA, while being mask-programmable instead of field-programmable, by configuring vias between metal layers in the integrated circuit. Each configuration bit in an FPGA can be replaced in a structured ASIC by either placing or not placing a via between metal contacts.

DETAILED DESCRIPTION

A structured ASIC device may be custom made to implement a user design by changing metal masks or via masks that are used to manufacture the device. The signal routing architecture for a structured ASIC device may be implemented in a way that allows a via layer to be edited to achieve a new signal routing configuration. The signal routing architecture may be achieved by placing wires in preferred and non-preferred directions (e.g., perpendicular vertical and horizontal directions) within a single metal layer. However, the reduction of the spacing (i.e., pitch) between the metal wires in modern semiconductor fabrication processes has made it more challenging to support layout design rules that enable wires to be placed in 2 perpendicular directions in a single metal layer. In a single metal layer having wires in 2 perpendicular directions, the wires are either placed at more than the minimum pitch or with restrictions on the spacing between vias and the placement of the vias. Also, editing the masks for additional metal layers of a structured ASIC device may require more masks to be produced, which adds to the cost to manufacture the device.

According to some embodiments disclosed herein, layout topologies for integrated circuits, such as structured ASIC devices, provide routing options that can be implemented by editing a single via mask independently of any restrictions on the direction of the routing conductors (i.e., wires) within a metal layer. Using the layout topologies disclosed herein, an edit to a single via layer can enable any programming for a routing crossbar, even if the conductors in each metal layer can only be routed in one preferred direction. These embodiments may reduce the cost of designing via masks for structured ASIC devices and may allow the throughput of structured ASIC devices to be increased during fabrication.

Throughout the specification, and in the claims, the term "connected" means a direct electrical connection between the circuits that are connected, without any intermediary devices. The term "coupled" means either a direct electrical connection between circuits or an indirect electrical connection through one or more passive or active intermediary devices. The term "circuit" may mean one or more passive and/or active electrical components that are arranged to cooperate with one another to provide a desired function.

Figure 1:
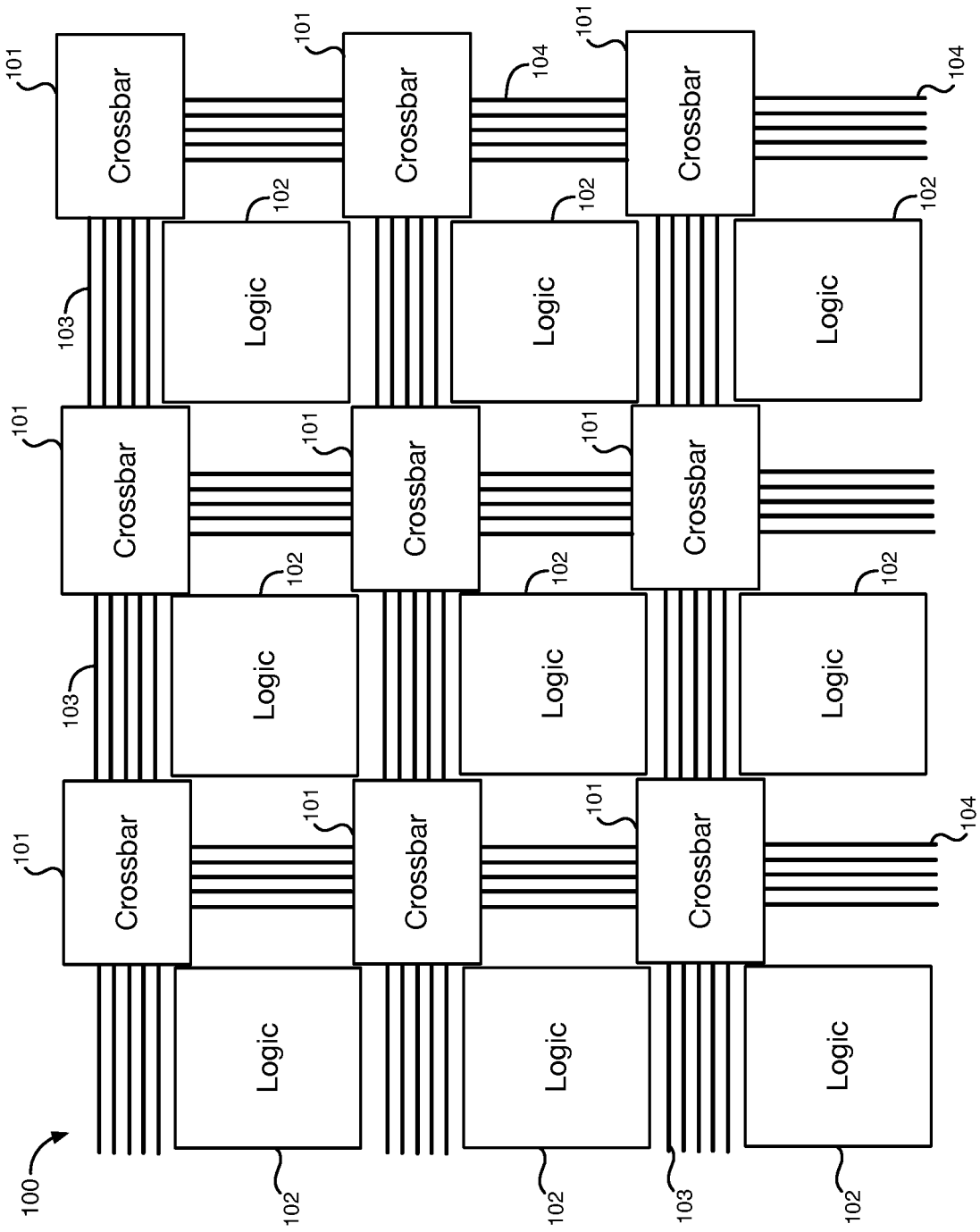
FIG. 1 is a layout diagram for an exemplary structured application specific integrated circuit (ASIC), according to an embodiment.

FIG. 1 is a layout diagram for an exemplary structured application specific integrated circuit (ASIC) 100, according to an embodiment. Structured ASIC 100 of Figure (FIG. ) 1 includes routing crossbars 101 and blocks 102 of logic cells. The blocks 102 of logic cells include logic gates formed of transistors and possibly other circuit elements, such as resistors and/or capacitors. The logic cells in blocks 102 implement logic functions for structured ASIC 100. The logic gates within blocks 102 are coupled together by modifying one or more metal layers and/or one or more via layers prior to fabrication of the structured ASIC. The routing crossbars 101 in structured ASIC 100 are also programmed prior to fabrication of the structured ASIC by modifying one or more metal layers and/or one or more via layers to enable any connectivity desired between the blocks 102 of logic cells. Routing crossbars 101 are coupled to each other through horizontal routing conductors 103 and vertical routing conductors 104 (i.e., conductive wires). Routing crossbars 101 are programmed prior to fabrication of the structured ASIC to couple together the blocks 102 of logic cells in a desired configuration. The blocks 102 of logic cells may, for example, be coupled to the conductors 103 through additional conductors (not shown) or directly to the crossbars 102.

Figure 2:
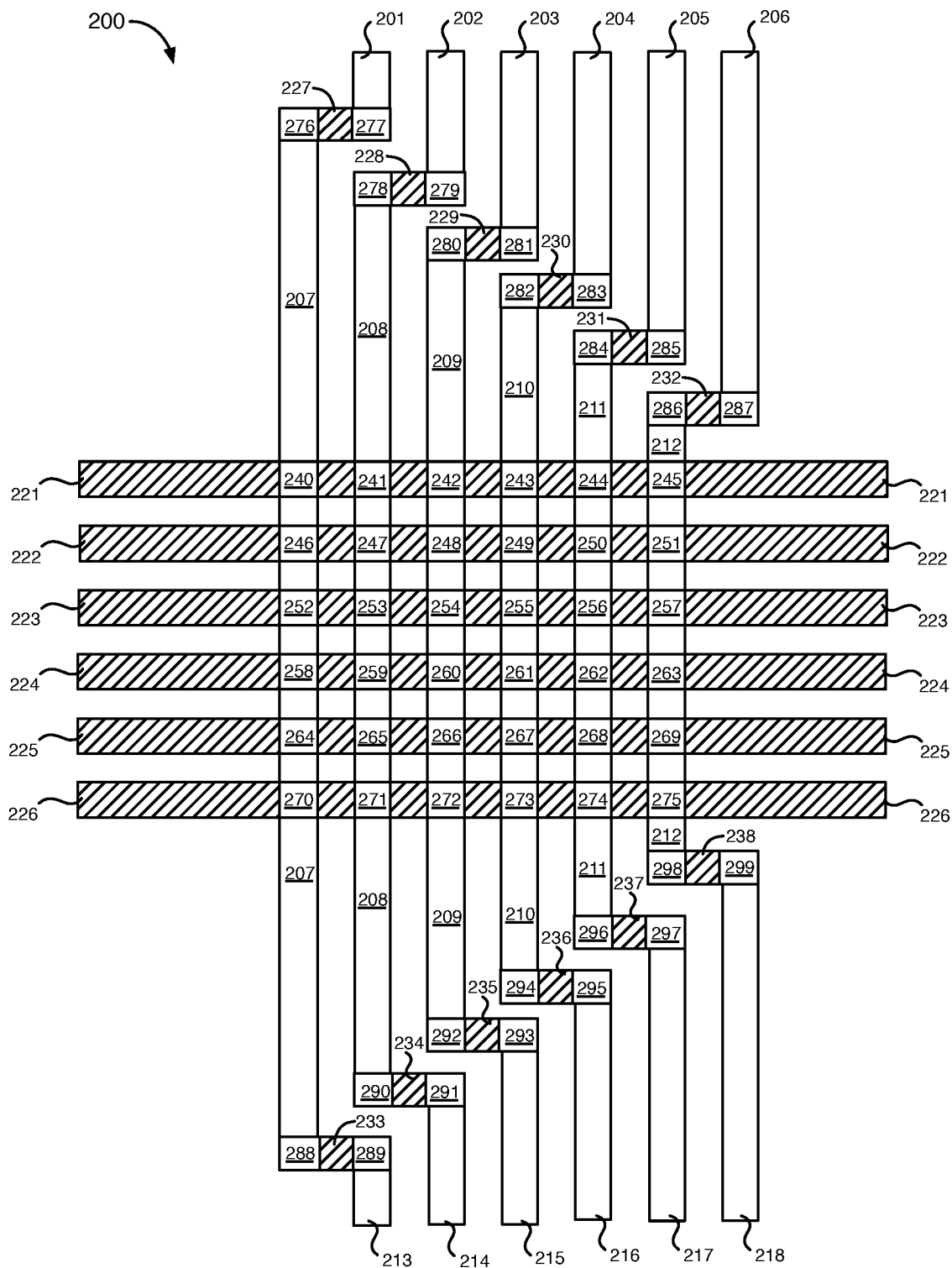
FIG. 2 is a top down view of a layout diagram for an exemplary routing crossbar, according to an embodiment.

FIG. 2 shows an example of a routing crossbar 200, according to an embodiment. According to various embodiments of FIG. 1, one of, a subset of, or all of the routing crossbars 101 in structured ASIC 100 may include instances of routing crossbar 200 (i.e., the layout of routing crossbar 200 shown in FIG. 2). According to other embodiments, one or more routing crossbars 200 may be fabricated in another type of ASIC, in a field programmable gate array, in a microprocessor, in a graphics processing unit, or in another type of integrated circuit (IC).

Routing crossbar 200 includes a first set of 18 conductors 201-218 (i.e., conductive wires) that are formed in a first conductive layer (e.g., a first metal layer) of the IC. Routing crossbar 200 also includes a second set of 18 conductors 221-238 (i.e., conductive wires) that are formed in a second conductive layer (e.g., a second metal layer) of the IC. Conductors 221-238 are further identified with diagonal lines in FIG. 2. The length of each of the conductors 201-218 extends only in the vertical direction in FIG. 2. The conductors 201-218 are parallel to each other in the vertical direction. The length of each of the conductors 221-238 extends only in a horizontal direction in FIG. 2. The conductors 221-238 are parallel to each other in the horizontal direction. Thus, the length of each of the conductors 201-218 and 221-238 in routing crossbar 200 only extend in one preferred direction within each of the conductive layers. Conductors 201-218 are orthogonal (perpendicular) to conductors 221-238. Conductors 221-226 may be extensions of conductors 103, and conductors 201-206 and 213-218 may be extensions of conductors 104 of FIG. 1.

Routing crossbar 200 also includes 60 vias 240-299. Each of the 60 vias 240-299 can be programmed (e.g., filled with conductive material) during fabrication of the IC to couple together one of the conductors 201-218 in the first conductive layer to one of the conductors 221-238 in the second conductive layer. A subset of the vias 240-275 in crossbar 200 are programmed during the fabrication of the IC to couple horizontal conductors 221-226 to selected ones of the vertical conductors 207-212. For example, conductor 221 may be coupled to one or more of conductors 207-212 by filling respective ones of vias 240-245 with conductive material during fabrication of the IC. Conductor 222 may be coupled to one or more of conductors 207-212 by filling respective ones of vias 246-251 with conductive material during fabrication of the IC. Conductor 223 may be coupled to one or more of conductors 207-212 by filling respective ones of vias 252-257 with conductive material during fabrication of the IC. Conductor 224 may be coupled to one or more of conductors 207-212 by filling respective ones of vias 258-263 with conductive material during fabrication of the IC. Conductor 225 may be coupled to one or more of conductors 207-212 by filling respective ones of vias 264-269 with conductive material during fabrication of the IC. Conductor 226 may be coupled to one or more of conductors 207-212 by filling respective ones of vias 270-275 with conductive material during fabrication of the IC. The remaining vias 240-275 are programmed to be non-conductive during fabrication of the IC.

Some photolithographic processes for fabricating integrated circuits are only tuned to resolve features in one direction. For example, some photolithographic processes can only form conductors (i.e., wires) that have a length extending in a single direction within one conductive layer. In these processes, horizontal conductors are formed in a first conductive layer, and vertical conductors are formed in a second conductive layer.

Figure 4:
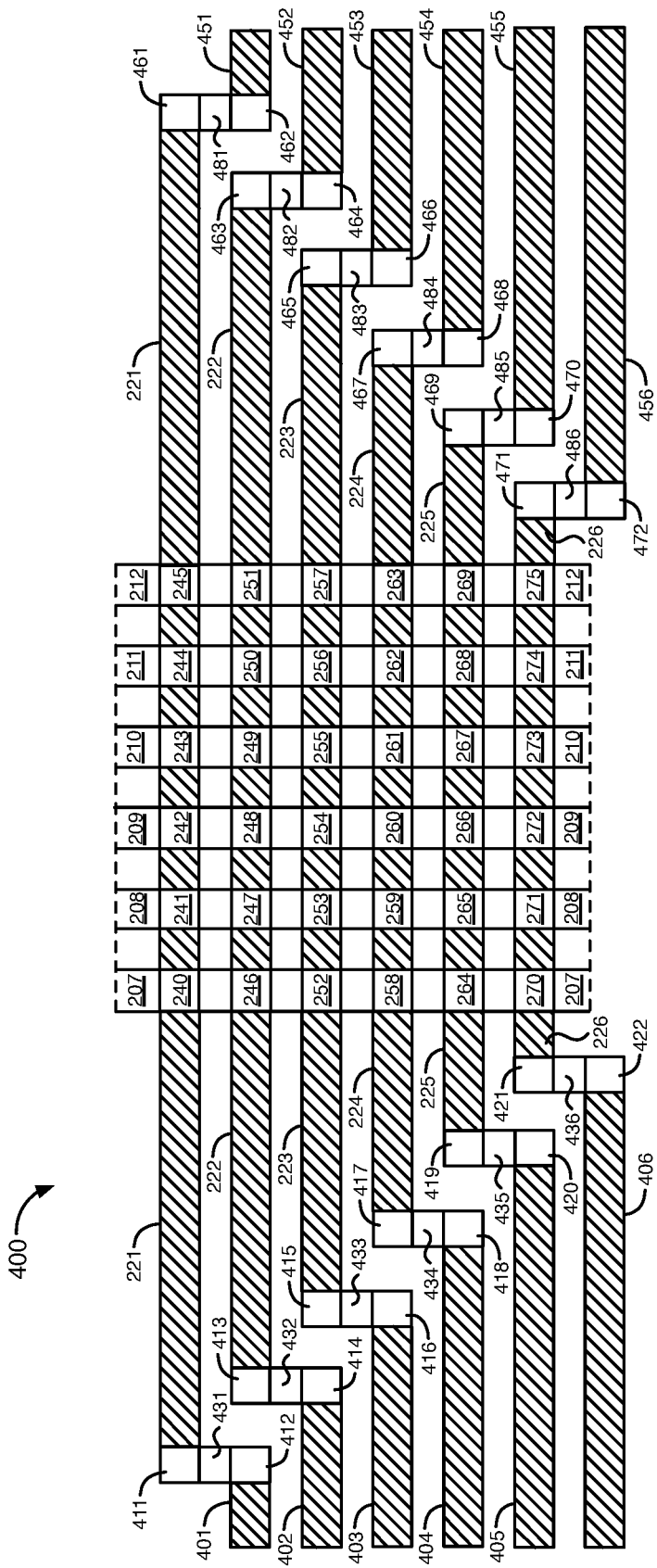
FIG. 4 is a top down view of a layout diagram for another exemplary routing crossbar, according to another embodiment.

According to some embodiments disclosed herein, a routing crossbar in an integrated circuit (IC) includes optional connections that are provided between first conductors routed only in a first direction in a first conductive layer of the IC. The optional connections include second conductors that are routed only in a second direction in a second conductive layer of the IC and vias that are programmable during fabrication of the IC. The second direction is perpendicular to the first direction. The optional connections between the first conductors may be programmed to be conductive or non-conductive by programming the vias. Any of the vias may be programmed to be conductive by filling the vias with conductive material during fabrication of the IC. Any of the vias can be programmed to be non-conductive by not filling the vias with conductive material during fabrication of the IC. Each of the optional connections can be programmed to couple or decouple two of the first conductors through a corresponding one of the second conductors and two of the vias. Examples of these embodiments are shown in FIG. 2 with respect to vertical conductors 201-218, horizontal conductors 227-238, and vias 276-299. Further examples of these embodiments are shown in FIG. 4 with respect to vertical conductors 431-436 and 481-486, horizontal conductors 221-226, 401-406, and 451-456, and vias 411-422 and 461-472.

Pairs of the vias 276-287 are optional connections that may be programmed to be conductive during fabrication of the IC to couple vertical conductors 201-206 to respective ones of vertical conductors 207-212 through respective ones of horizontal conductors 227-232. For example, vias 276-277 may be programmed to be conductive during fabrication of the IC to couple together vertical conductors 201 and 207 through horizontal conductor 227. Vias 276-277 may be programmed to be non-conductive during fabrication of the IC to decouple vertical conductors 201 and 207. Vias 278-279 may be programmed to be conductive during fabrication of the IC to couple together vertical conductors 202 and 208 through horizontal conductor 228. Vias 278-279 may be programmed to be non-conductive during fabrication of the IC to decouple vertical conductors 202 and 208. Vias 280-281 may be programmed to be conductive during fabrication of the IC to couple together vertical conductors 203 and 209 through horizontal conductor 229. Vias 280-281 may be programmed to be non-conductive during fabrication of the IC to decouple vertical conductors 203 and 209.

Vias 282-283 may be programmed to be conductive during fabrication of the IC to couple together vertical conductors 204 and 210 through horizontal conductor 230. Vias 282-283 may be programmed to be non-conductive during fabrication of the IC to decouple vertical conductors 204 and 210. Vias 284-285 may be programmed to be conductive during fabrication of the IC to couple together vertical conductors 205 and 211 through horizontal conductor 231. Vias 284-285 may be programmed to be non-conductive during fabrication of the IC to decouple vertical conductors 205 and 211. Vias 286-287 may be programmed to be conductive during fabrication of the IC to couple together vertical conductors 206 and 212 through horizontal conductor 232. Vias 286-287 may be programmed to be non-conductive during fabrication of the IC to decouple vertical conductors 206 and 212.

Pairs of the vias 288-299 are optional connections that may be programmed to be conductive during fabrication of the IC to couple vertical conductors 213-218 to respective ones of vertical conductors 207-212 through respective ones of horizontal conductors 233-238. For example, vias 288-289 may be programmed to be conductive during fabrication of the IC to couple together vertical conductors 207 and 213 through horizontal conductor 233. Vias 288-289 may be programmed to be non-conductive during fabrication of the IC to decouple vertical conductors 207 and 213. Vias 290-291 may be programmed to be conductive during fabrication of the IC to couple together vertical conductors 208 and 214 through horizontal conductor 234. Vias 290-291 may be programmed to be non-conductive during fabrication of the IC to decouple vertical conductors 208 and 214. Vias 292-293 may be programmed to be conductive during fabrication of the IC to couple together vertical conductors 209 and 215 through horizontal conductor 235. Vias 292-293 may be programmed to be non-conductive during fabrication of the IC to decouple vertical conductors 209 and 215.

Vias 294-295 may be programmed to be conductive during fabrication of the IC to couple together vertical conductors 210 and 216 through horizontal conductor 236.

Vias 294-295 may be programmed to be non-conductive during fabrication of the IC to decouple vertical conductors 210 and 216. Vias 296-297 may be programmed to be conductive during fabrication of the IC to couple together vertical conductors 211 and 217 through horizontal conductor 237. Vias 296-297 may be programmed to be non-conductive during fabrication of the IC to decouple vertical conductors 211 and 217. Vias 298-299 may be programmed to be conductive during fabrication of the IC to couple together vertical conductors 212 and 218 through horizontal conductor 238. Vias 298-299 may be programmed to be non-conductive during fabrication of the IC to decouple vertical conductors 212 and 218.

Figure 3:
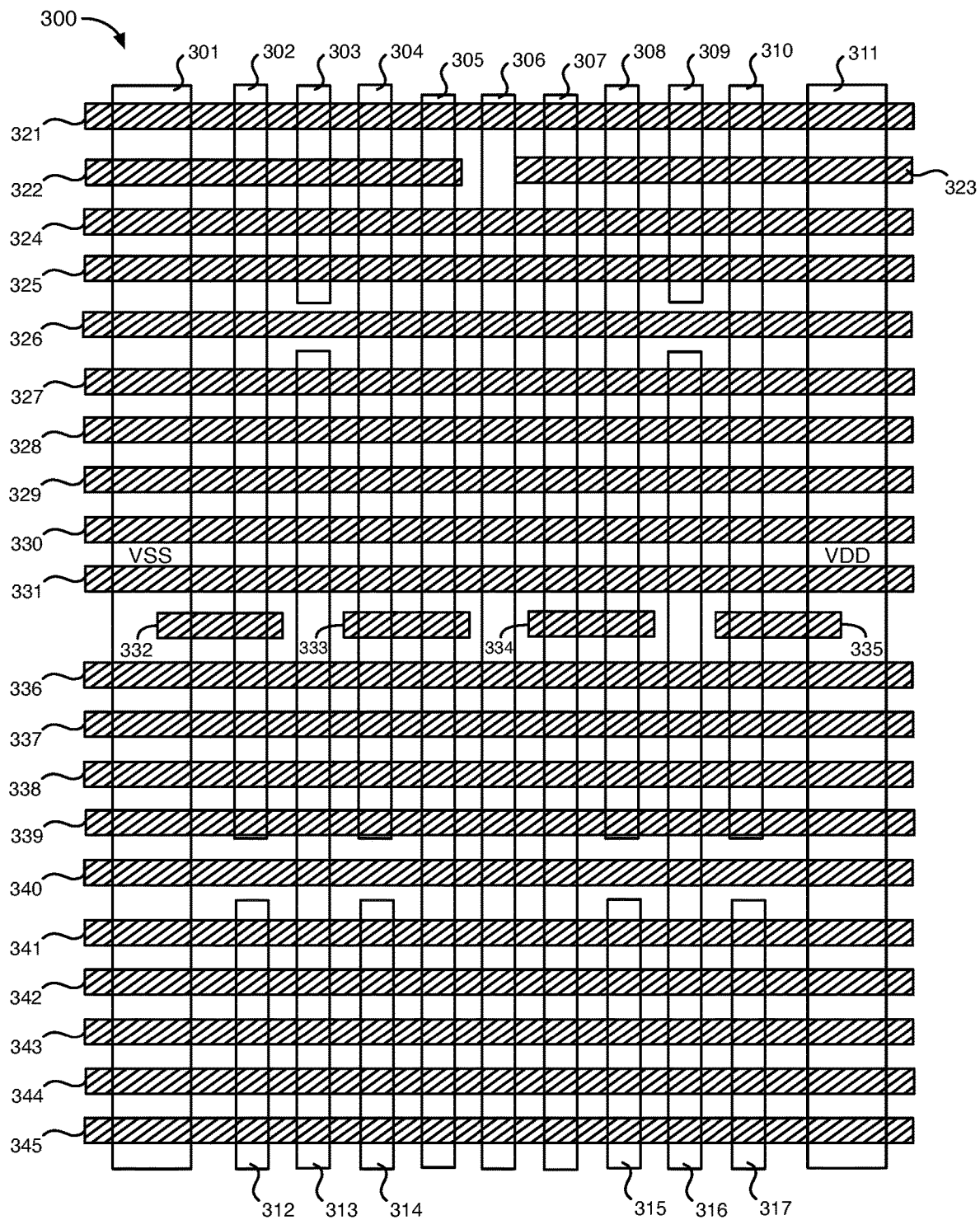
FIG. 3 is a top down view of a layout diagram that illustrates examples of conductors that are routed in two different directions in two conductive layers of an integrated circuit (IC) and that can be coupled to transistors in other layers of the IC to form a logic gate circuit, according to an embodiment.

According to other embodiments disclosed herein, transistors can be coupled together (e.g., to form logic gates) by programming vias during fabrication of the IC to couple together first conductors routed only in a first direction in a first conductive layer of the IC to second conductors routed only in a second direction in a second conductive layer of the IC. An example of these embodiments is disclosed herein with respect to FIG. 3. FIG. 3 is a top down view of a layout diagram that illustrates examples of conductors that are routed in two orthogonal directions in two conductive layers of an integrated circuit (IC) and that can be coupled to transistors formed in other layers of the IC to form a logic gate circuit 300, according to an embodiment. The logic gate circuit 300 includes vertical conductors 301-317 (i.e., conductive wires) that are formed in a first conductive layer (e.g., metal layer) of the IC. The logic gate circuit 300 also includes horizontal conductors 321-345 that are formed in a second conductive layer (e.g., metal layer) of the IC. The logic gate circuit 300 also includes transistors formed in additional layers of the IC that are not shown in the drawing of FIG. 3. The logic gate circuit 300 further includes vias that can be programmed during fabrication of the IC to couple any of the vertical conductors 301-317 to selected ones of the horizontal conductors 321-345 that cross over or under the vertical conductors. The vias of logic gate 300 are not shown in FIG. 3.

As a specific example that is not intended to be limiting, logic gate 300 may include 4 complementary metal oxide semiconductor (CMOS) inverter circuits. In this example, each of the 4 CMOS inverter circuits has an n-channel metal oxide semiconductor field-effect transistor (MOSFET) and a p-channel MOSFET that are coupled together between an input and an output. According to this example, conductors 301 and 311 provide ground voltage VSS and supply voltage VDD, respectively, to the inverter circuits. Voltage VSS may also be provided through any of the horizontal conductors that overlap with conductor 301 and that are coupled to conductor 301 through one or more vias (not shown). Supply voltage VDD may also be provided through any of the horizontal conductors that overlap with and are coupled to conductor 311 through one or more vias (not shown).

Conductors 332-335 may be coupled to the inputs of the 4 inverter circuits at the gates of each pair of p-channel and N-channel MOSFETs. Horizontal conductors 322-323, 341, and 344 may be coupled to provide input signals to the inputs of the four inverter circuits, for example, through vertical conductors 302, 310, 305, and 307, horizontal conductors 332, 335, 333, and 334, respectively, and vias (not shown) connecting these conductors. Horizontal conductors 327-331 may be coupled to the sources or drains of the p-channel transistors. Horizontal conductors 336-340 may be coupled to the sources or drains of the n-channel transistors. Conductors 324, 326, 342, and 345 may be coupled to the outputs of the 4 inverter circuits, for example, at the sources or drains of corresponding pairs of the transistors through any of vertical conductors 304, 306, 308, 313, or 316, horizontal conductors 327-331 or 336-340, and vias (not shown) connecting these conductors. Vertical conductors 303, 309, 312, 314, 315, and 317 may be used to couple together inputs of one or more of the inverter circuits to outputs of one or more of the inverter circuits through, for example, any of horizontal conductors 322-324, 341-342, and 344-345.

FIG. 4 is a top down view of a layout diagram for another exemplary routing crossbar, according to another embodiment. According to various embodiments of FIG. 1, one of, a subset of, or all of the routing crossbars 101 in structured ASIC 100 include instances of routing crossbar 400 (i.e., the layout of routing crossbar 400 shown in FIG. 4). According to other embodiments, one or more routing crossbars 400 may be fabricated in another type of ASIC, in a field programmable gate array, in a microprocessor, in a graphics processing unit, or in another type of integrated circuit (IC).

Routing crossbar 400 includes vertical conductors 431-436 and 481-486 (i.e., conductive wires) that are formed in the first conductive layer of the IC and that are parallel to each other. Routing crossbar 400 also includes horizontal conductors 401-406, 451-456, and 221-226 (i.e., conductive wires) that are formed in the second conductive layer of the IC and that are parallel to each other and orthogonal to the vertical conductors. Conductors 401-406 and 451-456 may be extensions of conductors 103 of FIG. 1. Routing crossbar 400 also includes vias 411-422 and 461-472. FIG. 4 also shows additional elements of routing crossbar 400 that are shown in and described above with respect to FIG. 2. The portions of conductors 207-212 above and below the dotted lines are not shown in FIG. 4. In some embodiments, routing crossbar 400 may also include the couplings shown in and described above with respect to in FIG. 2 between vertical conductors 207-212 and vertical conductors 201-206 and 213-218 through horizontal conductors 227-232 and 233-238.

Pairs of the vias 411-422 may be programmed to be conductive during fabrication of the IC to couple horizontal conductors 401-406 to respective ones of horizontal conductors 221-226 through respective ones of vertical conductors 431-436. For example, vias 411-412 may be programmed to be conductive during fabrication of the IC to couple together horizontal conductors 401 and 221 through vertical conductor 431. Vias 411-412 may be programmed to be non-conductive during fabrication of the IC to decouple horizontal conductors 401 and 221. Vias 413-414 may be programmed to be conductive during fabrication of the IC to couple together horizontal conductors 402 and 222 through vertical conductor 432. Vias 413-414 may be programmed to be non-conductive during fabrication of the IC to decouple horizontal conductors 402 and 222. Vias 415-416 may be programmed to be conductive during fabrication of the IC to couple together horizontal conductors 403 and 223 through vertical conductor 433. Vias 415-416 may be programmed to be non-conductive during fabrication of the IC to decouple horizontal conductors 403 and 223.

Vias 417-418 may be programmed to be conductive during fabrication of the IC to couple together horizontal conductors 404 and 224 through vertical conductor 434. Vias 417-418 may be programmed to be non-conductive during fabrication of the IC to decouple horizontal conductors 404 and 224. Vias 419-420 may be programmed to be conductive during fabrication of the IC to couple together horizontal conductors 405 and 225 through vertical conductor 435. Vias 419-420 may be programmed to be non-conductive during fabrication of the IC to decouple horizontal conductors 405 and 225. Vias 421-422 may be programmed to be conductive during fabrication of the IC to couple together horizontal conductors 406 and 226 through vertical conductor 436. Vias 421-422 may be programmed to be non-conductive during fabrication of the IC to decouple horizontal conductors 406 and 226.

Vias 461-462 may be programmed to be conductive during fabrication of the IC to couple together horizontal conductors 451 and 221 through vertical conductor 481. Vias 461-462 may be programmed to be non-conductive during fabrication of the IC to decouple horizontal conductors 451 and 221. Vias 463-464 may be programmed to be conductive during fabrication of the IC to couple together horizontal conductors 452 and 222 through vertical conductor 482. Vias 463-464 may be programmed to be non-conductive during fabrication of the IC to decouple horizontal conductors 452 and 222. Vias 465-466 may be programmed to be conductive during fabrication of the IC to couple together horizontal conductors 453 and 223 through vertical conductor 483. Vias 465-466 may be programmed to be non-conductive during fabrication of the IC to decouple horizontal conductors 453 and 223.

Vias 467-468 may be programmed to be conductive during fabrication of the IC to couple together horizontal conductors 454 and 224 through vertical conductor 484. Vias 467-468 may be programmed to be non-conductive during fabrication of the IC to decouple horizontal conductors 454 and 224. Vias 469-470 may be programmed to be conductive during fabrication of the IC to couple together horizontal conductors 225 and 455 through vertical conductor 485. Vias 469-470 may be programmed to be non-conductive during fabrication of the IC to decouple horizontal conductors 455 and 225. Vias 471-472 may be programmed to be conductive during fabrication of the IC to couple together horizontal conductors 226 and 456 through vertical conductor 486. Vias 471-472 may be programmed to be non-conductive during fabrication of the IC to decouple horizontal conductors 456 and 226.

The following examples pertain to further embodiments. Example 1 is an integrated circuit comprising: a first routing crossbar; and a second routing crossbar comprising first conductors routed in a first direction in a first conductive layer of the integrated circuit and second conductors routed in a second direction in a second conductive layer of the integrated circuit, wherein the second direction is perpendicular to the first direction, wherein a first subset of the first conductors is coupled to the first routing crossbar, wherein the first subset of the first conductors is coupled to a second subset of the first conductors through a first subset of the second conductors that is coupled to the first and second subsets of the first conductors through first vias, wherein the second subset of the first conductors is coupled to a second subset of the second conductors to through second vias, and wherein at least one of the first conductors is decoupled from another one of the first conductors by third vias.

In Example 2, the integrated circuit of Example 1 may optionally further comprise: a third routing crossbar, wherein a third subset of the first conductors is coupled to the third routing crossbar, and wherein the second subset of the first conductors are decoupled from the third subset of the first conductors by fourth vias.

In Example 3, the integrated circuit of Example 1 may optionally further comprise: a third routing crossbar, wherein a third subset of the first conductors is coupled to the third routing crossbar, wherein the third subset of the first conductors is coupled to a fourth subset of the first conductors through a third subset of the second conductors that are coupled to the third and fourth subsets of the first conductors through fourth vias, and wherein the fourth subset of the first conductors is coupled to a fourth subset of the second conductors through fifth vias.

In Example 4, the integrated circuit of Example 3 may further comprise: a fourth routing crossbar coupled to the fourth subset of the second conductors.

In Example 5, the integrated circuit of Example 1 may optionally further comprise: a third routing crossbar, wherein the second subset of the second conductors is coupled to a third subset of the second conductors through a third subset of the first conductors that is coupled to the second and third subsets of the second conductors through fourth vias, and wherein the third subset of the second conductors is coupled to the third routing crossbar.

In Example 6, the integrated circuit of Example 5 may optionally further comprise: a fourth routing crossbar, wherein the second subset of the second conductors is coupled to a fourth subset of the second conductors through a fourth subset of the first conductors that is coupled to the second and fourth subsets of the second conductors through fifth vias, and wherein the fourth subset of the second conductors is coupled to the fourth routing crossbar.

In Example 7, the integrated circuit of Example 5 may optionally further comprise: a fourth routing crossbar, wherein a fourth subset of the second conductors is coupled to the fourth routing crossbar, wherein the fourth subset of the second conductors is coupled to a fifth subset of the second conductors through a fourth subset of the first conductors that is coupled to the fourth and fifth subsets of the second conductors through fifth vias, and wherein the fifth subset of the second conductors is coupled to a fifth subset of the first conductors.

In Example 8, the integrated circuit of Example 7 may optionally further comprise: a fifth routing crossbar, wherein the fifth subset of the first conductors is coupled to a sixth subset of the first conductors through a sixth subset of the second conductors that is coupled to the fifth and sixth subsets of the first conductors through sixth vias, and wherein the sixth subset of the first conductors is coupled to the fifth routing crossbar.

In Example 9, the integrated circuit of any one of Examples 1-8 may optionally further comprise, wherein the integrated circuit is a structured application specific integrated circuit.

Example 10 is an integrated circuit comprising: first and second routing crossbars; and a third routing crossbar comprising first conductors routed in a first direction in a first conductive layer of the integrated circuit and second conductors routed in a second direction that is perpendicular to the first direction in a second conductive layer of the integrated circuit, wherein the third routing crossbar further comprises vias between the first and second conductive layers, wherein a first subset of the vias couples a first subset of the first conductors to a second subset of the first conductors through a first subset of the second conductors, wherein a second subset of the vias couples the second subset of the first conductors to a second subset of the second conductors, wherein a third subset of the vias decouples the second subset of the first conductors from a third subset of the first conductors, wherein the second subset of the second conductors is coupled to the second routing crossbar, and wherein the first subset of the first conductors is coupled to the first routing crossbar.

In Example 11, the integrated circuit of Example 10 may optionally further comprise: a fourth routing crossbar coupled to the third subset of the first conductors.

In Example 12, the integrated circuit of any one of Examples 10-11 may optionally further comprise, wherein a fourth subset of the vias couples the second subset of the second conductors to a third subset of the second conductors through a fourth subset of the first conductors, and wherein the third subset of the second conductors is coupled to the second routing crossbar.

In Example 13, the integrated circuit of Example 12 may optionally further comprise: a fourth routing crossbar, wherein a fifth subset of the vias decouples the second subset of the second conductors from a fourth subset of the second conductors that is coupled to the fourth routing crossbar.

In Example 14, the integrated circuit of Example 12 may optionally further comprise: a fourth routing crossbar, wherein a fifth subset of the vias couples the second subset of the second conductors to a fourth subset of the second conductors through a fifth subset of the first conductors, and wherein the fourth subset of the second conductors is coupled to the fourth routing crossbar.

In Example 15, the integrated circuit of any one of Examples 10-14 may optionally further include, wherein the integrated circuit is a structured application specific integrated circuit.

Example 16 is a method for fabricating a first routing crossbar in an integrated circuit, the method comprising: providing first conductors routed in a first direction in a first conductive layer of the integrated circuit; providing second conductors routed in a second direction that is perpendicular to the first direction in a second conductive layer of the integrated circuit; coupling a first subset of the first conductors to a second routing crossbar; programming first vias to couple the first subset of the first conductors to a second subset of the first conductors through a first subset of the second conductors; programming second vias to couple the second subset of the first conductors to a second subset of the second conductors; and programming third vias to decouple the second subset of the first conductors from a third subset of the first conductors that are coupled to a third routing crossbar.

In Example 17, the method of Example 16 may optionally further comprise: programming fourth vias to couple the second subset of the second conductors to a third subset of the second conductors through a fourth subset of the first conductors, wherein the third subset of the second conductors are coupled to a fourth routing crossbar.

In Example 18, the method of Example 17 may optionally further comprise: programming fifth vias to decouple the second subset of the second conductors from a fourth subset of the second conductors that are coupled to a fifth routing crossbar.

In Example 19, the method of Example 16 may optionally further comprise: programming fourth vias to couple a fourth subset of the first conductors to a fifth subset of the first conductors through a third subset of the second conductors, wherein the fourth subset of the first conductors are coupled to the third routing crossbar; and programming fifth vias to couple the fifth subset of the first conductors to a fourth subset of the second conductors, wherein the fourth subset of the second conductors are coupled to a fourth routing crossbar.

In Example 20, the method of Example 19 may optionally further comprise: programming sixth vias to couple the fourth subset of the second conductors to a fifth subset of the second conductors through a sixth subset of the first conductors, wherein the fifth subset of the second conductors are coupled to the fourth routing crossbar.

In Example 21, the method of any one of Examples 16-20 may optionally include, wherein the integrated circuit is a structured application specific integrated circuit.

The foregoing description of the exemplary embodiments has been presented for the purpose of illustration. The foregoing description is not intended to be exhaustive or to be limiting to the examples disclosed herein. In some instances, various features can be employed without a corresponding use of other features as set forth. Many modifications, substitutions, and variations are possible in light of the above teachings, without departing from the scope of the present embodiments.

What is claimed is:

1. An integrated circuit comprising:
  a first routing crossbar;
  a second routing crossbar comprising first conductors routed in a first direction in a first conductive layer of the integrated circuit and second conductors routed in a second direction in a second conductive layer of the integrated circuit, wherein the second direction is perpendicular to the first direction, wherein a first subset of the first conductors is coupled to the first routing crossbar,
  wherein the first subset of the first conductors is coupled to a second subset of the first conductors through a first subset of the second conductors that is coupled to the first and the second subsets of the first conductors through first vias,
  wherein the second subset of the first conductors is coupled to a second subset of the second conductors through second vias, and wherein at least one of the first conductors is decoupled from another one of the first conductors by third vias; and
  a third routing crossbar, wherein the second subset of the second conductors is coupled to a third subset of the second conductors through a third subset of the first conductors that is coupled to the second and the third subsets of the second conductors through fourth vias, and wherein the third subset of the second conductors is coupled to the third routing crossbar.

2. The integrated circuit of claim 1 further comprising:
  a fourth routing crossbar, wherein a fourth subset of the first conductors is coupled to the fourth routing crossbar, and wherein the second subset of the first conductors are decoupled from the fourth subset of the first conductors by fifth vias.

3. The integrated circuit of claim 1 further comprising:
  a fourth routing crossbar, wherein a fourth subset of the first conductors is coupled to the fourth routing crossbar, wherein the fourth subset of the first conductors is coupled to a fifth subset of the first conductors through a fourth subset of the second conductors that are coupled to the fourth and the fifth subsets of the first conductors through fifth vias, and wherein the fifth subset of the first conductors is coupled to a fifth subset of the second conductors through sixth vias.

4. Integrated circuit of claim 3 further comprising:
  a fifth routing crossbar coupled to the fifth subset of the second conductors.

5. The integrated circuit of claim 1,
  wherein each of the first conductors in the first subset of the first conductors is coupled one of the first conductors in the second subset of the first conductors through one of the second conductors in the first subset of the second conductors and through two of the first vias.

6. The integrated circuit of claim 1 further comprising:
a fourth routing crossbar, wherein the second subset of the second conductors is coupled to a fourth subset of the second conductors through a fourth subset of the first conductors that is coupled to the second and the fourth subsets of the second conductors through fifth vias, and wherein the fourth subset of the second conductors is coupled to the fourth routing crossbar.

7. The integrated circuit of claim 1 further comprising:
a fourth routing crossbar, wherein a fourth subset of the second conductors is coupled to the fourth routing crossbar, wherein the fourth subset of the second conductors is coupled to a fifth subset of the second conductors through a fourth subset of the first conductors that is coupled to the fourth and the fifth subsets of the second conductors through fifth vias, and wherein the fifth subset of the second conductors is coupled to a fifth subset of the first conductors.

8. The integrated circuit of claim 7 further comprising:
a fifth routing crossbar, wherein the fifth subset of the first conductors is coupled to a sixth subset of the first conductors through a sixth subset of the second conductors that is coupled to the fifth and the sixth subsets of the first conductors through sixth vias, and wherein the sixth subset of the first conductors is coupled to the fifth routing crossbar.

9. The integrated circuit of claim 1, wherein the integrated circuit is a structured application specific integrated circuit.

10. An integrated circuit comprising:
first and second routing crossbars; and
a third routing crossbar comprising first conductors routed in a first direction in a first conductive layer of the integrated circuit and second conductors routed in a second direction that is perpendicular to the first direction in a second conductive layer of the integrated circuit, wherein the third routing crossbar further comprises vias between the first and the second conductive layers, wherein a first subset of the vias couples a first subset of the first conductors to a second subset of the first conductors through a first subset of the second conductors,
wherein a second subset of the vias couples the second subset of the first conductors to a second subset of the second conductors, wherein a third subset of the vias decouples the second subset of the first conductors from a third subset of the first conductors, wherein the second subset of the second conductors is coupled to the second routing crossbar, and wherein the first subset of the first conductors is coupled to the first routing crossbar.

11. The integrated circuit of claim 10 further comprising:
a fourth routing crossbar coupled to the third subset of the first conductors.

12. The integrated circuit of claim 10, wherein a fourth subset of the vias couples the second subset of the second conductors to a third subset of the second conductors through a fourth subset of the first conductors, and wherein the third subset of the second conductors is coupled to the second routing crossbar.

13. The integrated circuit of claim 12 further comprising:
a fourth routing crossbar, wherein a fifth subset of the vias decouples the second subset of the second conductors from a fourth subset of the second conductors that is coupled to the fourth routing crossbar.

14. The integrated circuit of claim 12 further comprising:
a fourth routing crossbar, wherein a fifth subset of the vias couples the second subset of the second conductors to a fourth subset of the second conductors through a fifth subset of the first conductors, and wherein the fourth subset of the second conductors is coupled to the fourth routing crossbar.

15. The integrated circuit of claim 10, wherein the integrated circuit is a structured application specific integrated circuit.

16. A method for fabricating a first routing crossbar in an integrated circuit, the method comprising:
providing first conductors routed in a first direction in a first conductive layer of the integrated circuit;
providing second conductors routed in a second direction that is perpendicular to the first direction in a second conductive layer of the integrated circuit;
coupling a first subset of the first conductors to a second routing crossbar;
programming first vias to couple the first subset of the first conductors to a second subset of the first conductors through a first subset of the second conductors;
programming second vias to couple the second subset of the first conductors to a second subset of the second conductors; and
programming third vias to decouple the second subset of the first conductors from a third subset of the first conductors that are coupled to a third routing crossbar.

17. The method of claim 16 further comprising:
programming fourth vias to couple the second subset of the second conductors to a third subset of the second conductors through a fourth subset of the first conductors, wherein the third subset of the second conductors are coupled to a fourth routing crossbar.

18. The method of claim 17 further comprising:
programming fifth vias to decouple the second subset of the second conductors from a fourth subset of the second conductors that are coupled to a fifth routing crossbar.

19. The method of claim 16 further comprising:
programming fourth vias to couple a fourth subset of the first conductors to a fifth subset of the first conductors through a third subset of the second conductors, wherein the fourth subset of the first conductors are coupled to the third routing crossbar; and
programming fifth vias to couple the fifth subset of the first conductors to a fourth subset of the second conductors, wherein the fourth subset of the second conductors are coupled to a fourth routing crossbar.

20. The method of claim 19 further comprising:
programming sixth vias to couple the fourth subset of the second conductors to a fifth subset of the second conductors through a sixth subset of the first conductors, wherein the fifth subset of the second conductors are coupled to the fourth routing crossbar.

* * * * *